United States Patent
Shi et al.

(10) Patent No.: US 8,674,482 B2
(45) Date of Patent: Mar. 18, 2014

(54) SEMICONDUCTOR CHIP WITH THROUGH-SILICON-VIA AND SIDEWALL PAD

(75) Inventors: Xunqing Shi, New Territories (HK); Bin Xie, New Territories (HK); Chang Hwa Chung, New Territories (HK)

(73) Assignee: Hong Kong Applied Science and Technology Research Institute Co. Ltd., Shatin, New Territories (HK)

( * ) Notice: Subject to any disclaimer, the term of this patent is extended or adjusted under 35 U.S.C. 154(b) by 543 days.

(21) Appl. No.: 12/273,434

(22) Filed: Nov. 18, 2008

(65) Prior Publication Data

US 2010/0123241 A1  May 20, 2010

(51) Int. Cl.
*H01L 29/40* (2006.01)

(52) U.S. Cl.
USPC .............. 257/621; 257/777; 257/E25.013

(58) Field of Classification Search
USPC .......................... 257/686, 777, 621
See application file for complete search history.

(56) References Cited

U.S. PATENT DOCUMENTS

| | | | |
|---|---|---|---|
| 5,281,852 A | 1/1994 | Normington | |
| 5,434,745 A | 7/1995 | Shokrgozar et al. | |
| 5,682,062 A | 10/1997 | Gaul | |
| 5,790,380 A | 8/1998 | Frankeny | |
| 5,933,712 A | 8/1999 | Bernhardt et al. | |
| 6,433,413 B1 | 8/2002 | Farrar | |
| 6,472,746 B2* | 10/2002 | Taniguchi et al. | 257/723 |
| 6,683,372 B1* | 1/2004 | Wong et al. | 257/686 |
| 7,148,565 B2 | 12/2006 | Kim et al. | |
| 7,391,106 B2 | 6/2008 | Kang | |
| 7,791,175 B2* | 9/2010 | Pyeon | 257/621 |
| 8,053,898 B2* | 11/2011 | Marcoux | 257/773 |
| 8,399,973 B2* | 3/2013 | Oh et al. | 257/686 |
| 2003/0067001 A1* | 4/2003 | Poo et al. | 257/48 |
| 2004/0124539 A1* | 7/2004 | Yang et al. | 257/777 |
| 2004/0163843 A1 | 8/2004 | Shin | |
| 2007/0158807 A1 | 7/2007 | Lu et al. | |
| 2007/0194455 A1* | 8/2007 | Ikeda et al. | 257/777 |
| 2009/0180257 A1* | 7/2009 | Park et al. | 361/709 |
| 2012/0007253 A1* | 1/2012 | Yang | 257/774 |

FOREIGN PATENT DOCUMENTS

| | | |
|---|---|---|
| CN | 1155760 | 7/1997 |
| CN | 1893063 | 1/2007 |
| JP | 2008135763 | 6/2008 |
| JP | 2008263005 | 10/2008 |

OTHER PUBLICATIONS

International Search Report and the Written Opinion of the international searching authority, or the declaration dated Aug. 27, 2009 for PCT/CN2008/073100,12 pages.

* cited by examiner

*Primary Examiner* — Benjamin Sandvik
(74) *Attorney, Agent, or Firm* — Berkeley Law & Technology Group, LLP

(57) ABSTRACT

Subject matter disclosed herein may relate to packaging for multi-chip semiconductor devices as may be used, for example, in flash memory devices. In an example embodiment, a semiconductor chip may comprise a through-silicon via and a sidewall pad.

16 Claims, 10 Drawing Sheets

200

Silicon Layer 220

200

Integrated Circuit 210   Via Hole 260                    Silicon Layer 220

Partial Depth Hole 265

200

Isolation Layer 225

200

Adhesion Layer 270

SEMICONDUCTOR CHIP WITH THROUGH-SILICON-VIA AND SIDEWALL PAD

FIELD

Subject matter disclosed herein may relate to multi-chip semiconductor devices as may be used, for example, in flash memory devices.

BACKGROUND

Integrated circuits may form fundamental aspects of many electronic devices. In some case, it may be advantageous to combine multiple integrated circuit dice or "chips" in the same semiconductor device. For example, chips may be stacked one upon another, and the chips may be electrically connected to each other in some cases by way of wire-bonding, or in other cases through-silicon-vias, which may comprise electrical connections passing completely through a silicon wafer. In such arrangements of stacked chips, the bottom chip may provide electrical connections to a substrate. The substrate may redistribute signals and supply power to the stacked chips. The substrate may further be electrically connected to a printed circuit board, for example, through solder joints to permit the semiconductor device to interface with external devices and/or components. Multi-chip semiconductor devices may be utilized in a wide range of applications, including, for example, flash memory devices.

BRIEF DESCRIPTION OF THE FIGURES

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 1b is an illustration depicting a cross-sectional view of the example semiconductor device of FIG. 1a;

Figure 1A:
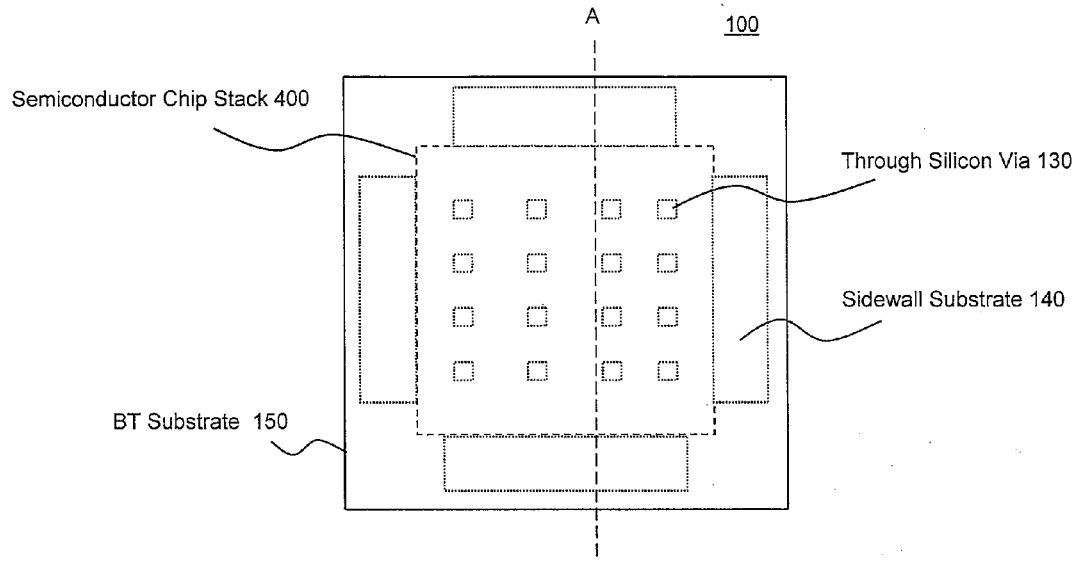
FIG. 1a is an illustration depicting a top view of an example embodiment of a multi-chip semiconductor device.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Reference throughout this specification to "one embodiment" or "an embodiment" means that a particular feature, structure, or characteristic described in connection with the embodiment is included in at least one embodiment of claimed subject matter. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

As discussed above, in some electronic devices, a number of semiconductor chips may be arranged in a stacked fashion in order to provide increased capabilities and in order to keep cost and size relatively small. "Multi-chip" semiconductor devices may be utilized in a wide range of electronic device types. For one example, a "stacked" arrangement of semiconductor chips may be particularly useful in flash memory devices. Of course, other device types may make advantageous use of stacked semiconductor chip configurations, as well as other multi-chip configurations.

One technique for stacking multiple chips includes wire-bonding. Wire-bonding may have some disadvantages, such as a relatively large form factor due to the relatively large wire loops and also the height of the stacked chips if wire-bonding is used. Another disadvantage may include relatively poor electrical performance, such as signal delay, due to the relatively long wire interconnects. At least in part in response to these potential disadvantages, through-silicon-via technologies are being developed.

As mentioned above, for stacked semiconductor chip implementations, semiconductor chips may utilize through-silicon-vias (TSV) to pass signals from one chip to another. As used herein, the term "through-silicon-via", as well as its abbreviation TSV, is meant to include any vertical electrical connection passing substantially completely through a silicon wafer, die, or chip. As used herein, the terms "die" and "chip" are synonymous, and may be used interchangeably. Generally, a "die" may refer to a rectangular fragment of a semiconductor wafer.

While stacked semiconductor chips with TSVs may provide some advantages, there may also be disadvantages. For example, TSVs may be useful to provide common signals to the various semiconductor chips that are part of the stack. Common signals may include, for example, address signals and/or data signals. As used herein, the term "common signal" is meant to include any signal that is intended to be shared among a number of the stacked chips. For many embodiments, common signals may be shared among all stacked chips. Thus, the TSVs pass the common signals from chip to chip, and the signals reach the various intended chips. For example, if the stacked chips form part of a flash memory device, address signals may need to be coupled to the various semiconductor chips. TSVs may be a relatively efficient was to provide these signals to the various elements of the stack. On the other hand, non-common signals, such as, for example, chip select signals, may not be efficiently handled with TSVs. Using TSVs for non-common signals may tend to significantly increase the amount of TSVs that may be required, leading to relatively large die sizes and increased cost and failure rates, for example.

Also, it may be advantageous to utilize existing semiconductor wafers, such as those designed for wire-bonding implementations, for example, with TSV technologies. However, with some TSV solutions, without changes to the wafer design, it may be difficult to accommodate enough TSV interconnects for both common and non-common signals due to lack of space. Of course, changes to chip designs may require large efforts and significant resources. One or more embodiments described herein provide TSV interconnects without requiring changes to wafer designs, and accommodate both common and non-common signals In one embodiment, non-common signals may be routed from sidewall pads on the semiconductor dice to a substrate, such as a substrate comprising bismaleimide triazine (BT), by way of a flexible sidewall substrate. Also for this example embodiment, one or more common signals may be routed to the substrate by way of one or more TSVs. As used herein, the term "non-common signal" refers to a signal that is intended for fewer than all of the chips in a stack. For many embodiments, the non-common signal may be intended for a single chip, although the scope of claimed subject matter is not limited in this respect. For a memory device, possible examples of non-common signals may include, but are not limited to, chip select and power signals.

FIG. 1a is an illustration depicting a top view of an example embodiment of a multi-chip semiconductor device 100. Semiconductor device 100 for this example comprises a semiconductor chip stack 120 including a number of discrete semiconductor dice place one on top of the other. For an embodiment, the chips may be bonded one to another at least in part by solder at a number of TSV sites 130, and the physical bond may be reinforced by layers of a polymer material between the chips. Semiconductor chip stack 120 for the present example embodiment may be electrically coupled to substrate 150. For an example embodiment, substrate 150 may comprise bismaleimide triazine (BT), although the scope of claimed subject matter is not limited in this respect.

Semiconductor chip stack 120 may be soldered to BT substrate 150 by way of TSVs 130, for one or more embodiments, and the physical bond may be reinforced with an underflow of a polymer material, although the scope of claimed subject matter is not limited in these respects.

Also for an embodiment, semiconductor chip stack 120 may comprise one or more sidewall substrates 140, which may also be referred to herein as sidewall connectors. For one or more embodiments, the sidewall substrates may comprise flexible sidewall substrates. For example, a sidewall substrate may comprise one or more metal signal lines on a flexible plastic backing that may be adhered to one or more sidewall pads by way of an adhesive, although the scope of claimed subject matter is not limited in these respects.

Figure 1B:
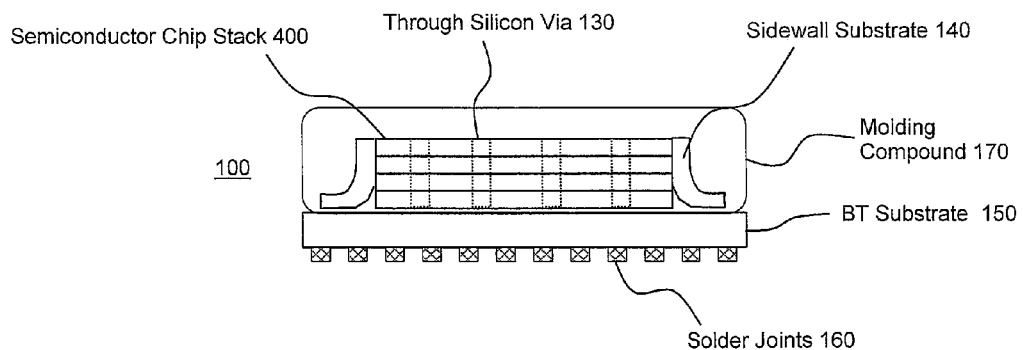

FIG. 1b is an illustration depicting a cross-sectional view of multi-chip semiconductor device 100. This illustration shows semiconductor chip stack 300 with several through-silicon-vias 130 and sidewall connectors 140. Semiconductor chip stack 400 for this example is disposed on BT substrate 150, and is encapsulated, at least in part, by material 170. TSVs 130 for an embodiment may electrically couple a plurality of common signals to substrate 150, and sidewall substrates 140 may electrically couple one or more non-common signals to BT substrate 150. For the embodiment depicted in FIGS. 1a and 1b, multi-chip semiconductor device 100 may comprise a NAND flash memory device, although the scope of claimed subject matter is not limited in this respect. For one or more embodiments, more than one type of chip may be incorporated into a chip stack. Examples of the types of chips that may be incorporated into a chip stack may include, but are not limited to, flash memory chips, dynamic random access memory (DRAM) chips, application specific integrated circuit (ASIC) chips, etc.

For an embodiment, sidewall substrate 140 may comprise a pair of polymer layers that surround a copper layer. At the surface of sidewall substrate 140 facing chip stack 400, a plurality of bonding pads may be formed that may be coupled to a number of sidewall connectors on the chips of chip stack 400. The bonding pads for an embodiment may comprise copper with a nickel/gold surface finish. The bonding pads may be electrically coupled to the middle metal layer of sidewall substrate 140 by way of vias. Further, for an embodiment, the copper layer sandwiched between the two polymer layers may not be a continuous layer, but may rather comprise a pattern to redistribute signals from chip stack 400 to the lower portion of sidewall substrate 140 for bonding and connecting the signals to BT substrate 150. Of course, this is merely an example embodiment of a sidewall substrate, and the scope of claimed subject matter is not limited in this respect.

For an embodiment, semiconductor chip stack 120 may be protected by a molding compound 170. Substrate 150 may also be protected, at least in part, for an example embodiment, although in other embodiments substrate 150 is not encapsulated by molding compound 170. Molding compound 170 may comprise, for an example embodiment, an epoxy-based polymer material, although the scope of claimed subject matter is not limited in this respect.

Figure 2A:
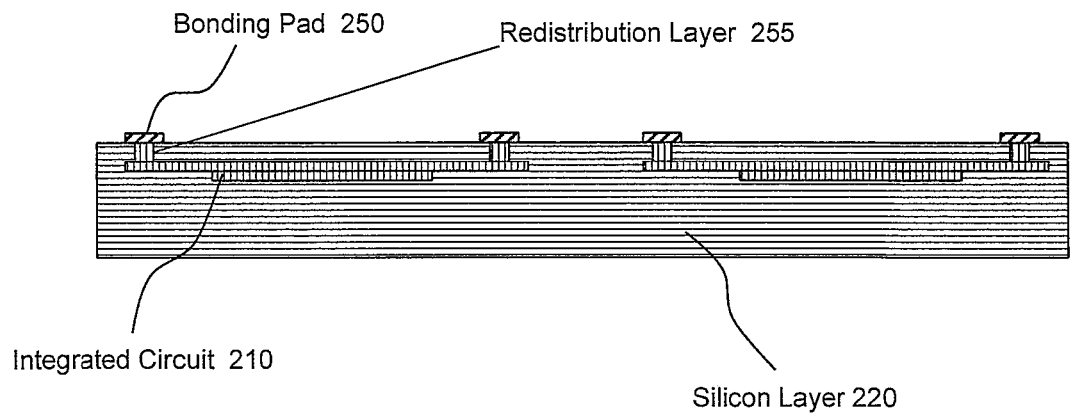
FIG. 2a is an illustration depicting an aspect of an example technique for forming a through-silicon-via and a sidewall pad for a semiconductor wafer.

FIG. 2a is an illustration depicting an aspect of an example technique for forming a through-silicon-via and a sidewall pad for a semiconductor wafer 200. In the figures that follow, a number of aspects of the example technique are depicted. Embodiments in accordance with claimed subject matter may include all, less than, or more than, the various aspects discussed. Further, the order of the aspects discussed is merely an example order, and the scope of claimed subject matter is not limited in this respect. Embodiments in accordance with claimed subject matter are not limited to the example techniques depicted herein. Rather, any technique now existing or developed in the future for forming a through-silicon-via and for forming a sidewall pad may be utilized. Also, the specific materials described herein are merely examples, and the scope of claimed subject matter is not limited to the specific examples described herein.

For the example depicted in FIG. 2a, wafer 200 may comprise an incoming wafer that may be purchased from Intel® Corporation or Samsung, for example. Wafer 200 may comprise many integrated circuits 210. For purposes of clarity, two integrated circuits 210 are depicted for the current example. Of course, the scope of claimed subject matter is not limited in this respect. For integrated circuits 210, there may be a number of bonding pads 250 that may comprise copper with a nickel/gold surface, for an example embodiment. However, this is merely an example of a bonding pad, and the scope of claimed subject matter is not limited in this respect. A redistribution layer 255 may provide interconnects between the bonding pads and the integrated circuits.

In general, a wafer such as wafer 200 may be cut into individual chips, and a number of chips may be stacked together in some cases. In implementations using wire-bonding techniques to interconnect the stacked chips, gold wire may be bonded to one bonding pad and also bonded to a bonding pad of another chip. Compared to wire-bonding based chip stacking, TSV technologies in general may have several advantages, including smaller form factor due to lack of wire loops, better electrical performance due to shorter interconnects, which may result in reduced signal delay and less power consumption. Other potential advantages may include ease of integration of different functional chip types, and lower overall manufacturing costs.

For one or more embodiments, in order to avoid integrated circuit and/or die redesign to provide adequate space to accommodate TSV interconnects for non-common signals, sidewall connectors may be formed for the non-common signals, TSV interconnects may be utilized for common signals, which may take advantage of the bonding pads already fabricated onto the existing wafer. Wafer 200, initially designed and intended for wire-bonding chip stacking implementations, for this example represents a starting point for the example operations described in FIGS. 2b-2j.

For an embodiment, semiconductor wafer 200 comprises a silicon layer 220. Also for an embodiment, integrated circuits 210 are supported within the silicon layer. Embodiments in accordance with claimed subject matter may include any type of integrated circuit, including, but not limited to, memory circuits, to name but one example. Further, integrated circuit 210 may be formed using any fabrication technique now known or developed in the future. As mentioned previously, for one or more embodiments, wafer 200 may comprise a previously manufactured wafer including the integrated circuits, the redistribution layer, and the bonding pads.

Figure 2B:
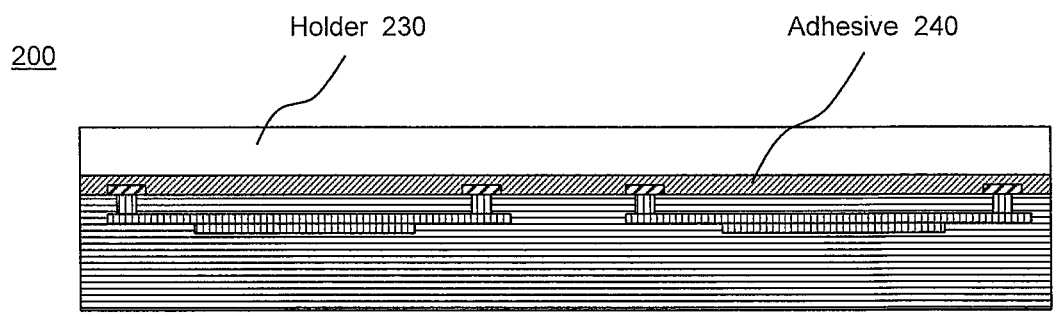
FIG. 2b is an illustration depicting an additional aspect of the example technique for forming the through-silicon-via and the sidewall pad for the semiconductor wafer, including bonding the wafer to a holder.

FIG. 2b is an illustration depicting an additional aspect of the current example technique for forming the through-silicon-via and the sidewall pad for semiconductor wafer 200. For an embodiment, a polymer based adhesive 240 may be prepared over the wafer, and a wafer holder 230 may be bonded to wafer 200. For one or more embodiments, holder 230 may comprise glass. For another embodiment, holder 230 may comprise silicon. However, these are merely example materials that may be used for holder 230, and the scope of claimed subject matter is not limited in this respect. Also for an embodiment, polymer based adhesive 240 may bond wafer 200 to holder 230 at a relatively low temperature, and the wafer may be de-bonded by exposing adhesive 240 to a relatively higher temperature. For an embodiment, adhesive 240 may comprise a thermoplastic polymer that may provide temporary bonding at temperatures below approximately 150° C. Also for an embodiment, the wafer may be debonded from holder 230 at a temperature ranging approximately from 180° C. to 210° C. However, the scope of claimed subject matter is not limited in these respects.

Figure 2C:
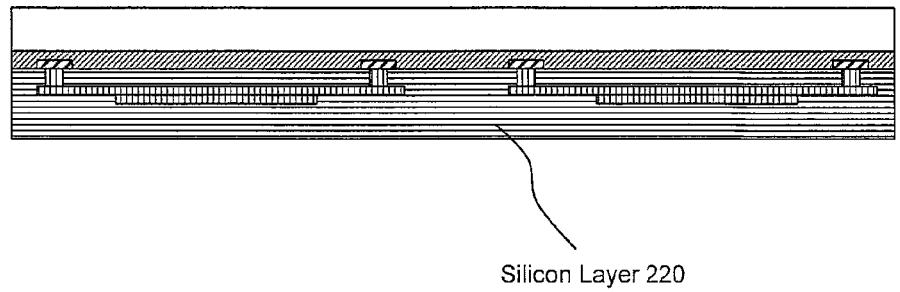
FIG. 2c is an illustration depicting a further aspect of the example technique for the forming through-silicon-via and the sidewall pad for the semiconductor wafer, including thinning the wafer.

FIG. 2c is an illustration depicting a further aspect of the example technique for the forming through-silicon-via and the sidewall pad for wafer 200. For one or more example embodiments, silicon layer 220 may be thinned. That is, the thickness of silicon layer 220 may be reduced. Although embodiments in accordance with claimed subject matter are not limited to any particular technique for reducing the thickness of the silicon layer, for one example embodiment silicon layer 220 may be thinned through a mechanical grinding process. Other possible techniques for thinning wafer 200 by reducing the thickness of silicon layer 220 may include, but are not limited to, chemical mechanical polishing, wet etching, and dry chemical etching, to name but a few examples. For one or more embodiments, wafer 200 may have a thickness in the range of approximately 300-400 μm before thinning, and may have a thickness in the range of approximately 50-100 μm after thinning, although again, the scope of claimed subject matter is not limited in this respect.

Figure 2D:
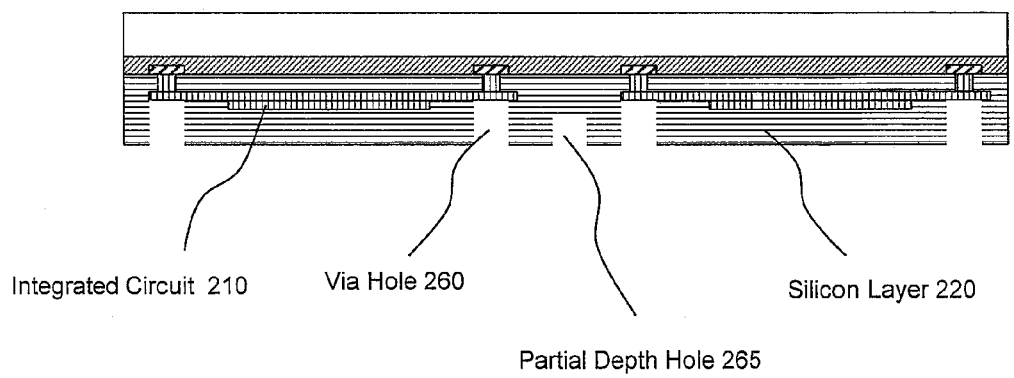
FIG. 2d is an illustration depicting another aspect of the example technique for forming the through-silicon-via and the sidewall pad for the semiconductor wafer, including drilling holes.

FIG. 2d is an illustration depicting another aspect of the example technique for forming the through-silicon-via and the sidewall pad for semiconductor wafer 200. For one or more embodiments, a number of via holes 260 with depths that extend through silicon layer 220 to reach integrated circuits 210. For the current embodiment, via holes 260 approximately coincide with the locations of the previous vias 255. However, these are merely example locations for the via holes, and the scope of claimed subject matter is not limited in this respect.

For an embodiment, a partial depth hole 265 may be formed at a location approximately mid-way between the two integrated circuits. For an embodiment, the location of partial depth hole 265 may comprise a location designated for the die saw. The depth of partial depth hole 265 for an embodiment is less deep than via holes 260. The scope of claimed subject matter is not limited to any particular depth for the partial depth hole.

Via holes 260 and partial depth hole 265 may be formed using any technique now known or to be developed in the future, for one or more embodiments. For one example embodiment, the various holes may be formed by a Deep Reactive Ion Etching (DRIE) process, including spinning a layer of photoresist material onto the surface of the wafer, and exposing and developing the photoresist to define the areas to be drilled. For another embodiment, a laser drilling method may be utilized. However, these are merely example techniques for creating the various holes, and the scope of claimed subject matter is not limited in these respects.

Figure 2E:
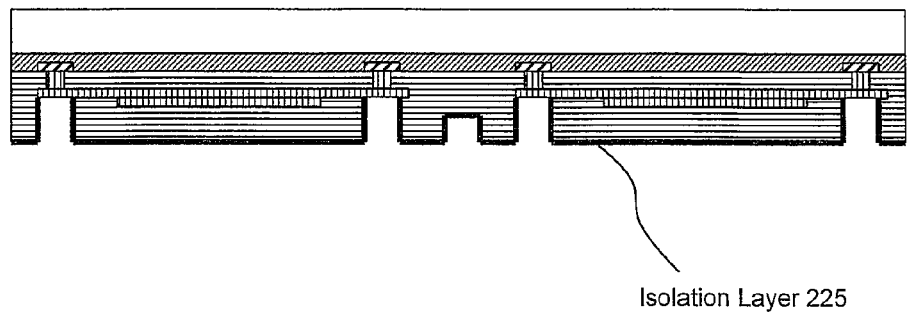
FIG. 2e is an illustration depicting an additional aspect of the example technique for forming the through-silicon-via and the sidewall pad for the semiconductor wafer, including forming an isolation layer.

FIG. 2e is an illustration depicting an additional aspect of the example technique for forming the through-silicon-via and the sidewall pad for semiconductor wafer 200. For one or more embodiments, an isolation layer 225 may be formed over the underside of the wafer, including forming the layer on the sidewalls of via holes 260, as well as on the sidewalls and bottom of partial depth hole 265. For an embodiment, isolation layer 225 may comprise silicon dioxide ($SiO_2$), although the scope of claimed subject matter is not limited in this respect, and other dielectric materials are possible. As with other aspects described herein, any technique now known or to be developed in the future for forming isolation layer 225 may be utilized. For an embodiment, isolation layer 225 may comprise $SiO_2$ prepared by plasma enhanced chemical vapor deposition (PECVD), and its thickness may be approximately 0.5 µm, although again, the scope of claimed subject matter is not limited in this respect.

Figure 2F:
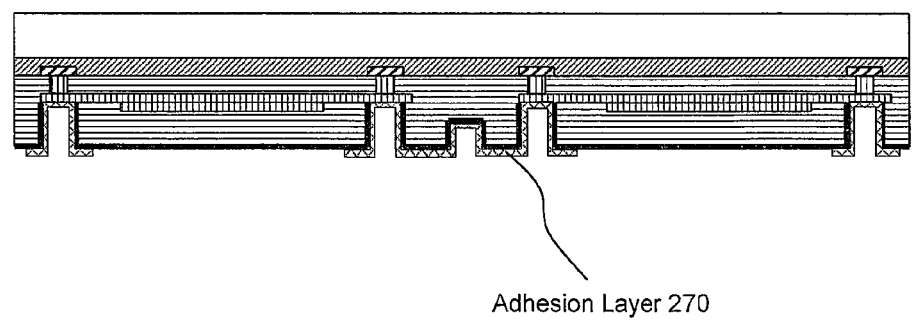
FIG. 2f is an illustration depicting a further aspect of the example technique for forming the through-silicon-via and the sidewall pad for a semiconductor wafer, including forming an adhesion layer.

FIG. 2f is an illustration depicting a further aspect of the example technique for forming the through-silicon-via and the sidewall pad for wafer 200. For an embodiment, an adhesion layer 270 may be formed over portions of the bottom of wafer 200. As depicted in FIG. 2f, adhesion layer 270 may be formed on the bottom surface of wafer 200 in the areas in and around vias 260 and partial depth hole 265. Adhesion layer 270 may adhere to both isolation layer 225 and to a seed layer (not shown) that may be formed after the formation of the adhesion layer to provide an electrode for an electroplating process, described below. The seed layer may comprise the same material used in the filling operations described below, although the scope of claimed subject matter is not limited in this respect. For an embodiment, adhesion layer 270 and the seed layer may be prepared using a sputtering technique, although the scope of claimed subject matter is not limited in this respect. For an embodiment, adhesion layer 270 may also serve as a barrier layer to prevent potentially undesirable reactions between copper conductors (not depicted in FIG. 2f) within the via holes and exposed dielectric material 225 or silicon layer 220. For an embodiment, adhesion layer 270 may comprise titanium tungsten with a thickness of about 0.1 to 0.2 µm, although the scope of claimed subject matter is not limited in this respect.

Figure 2G:
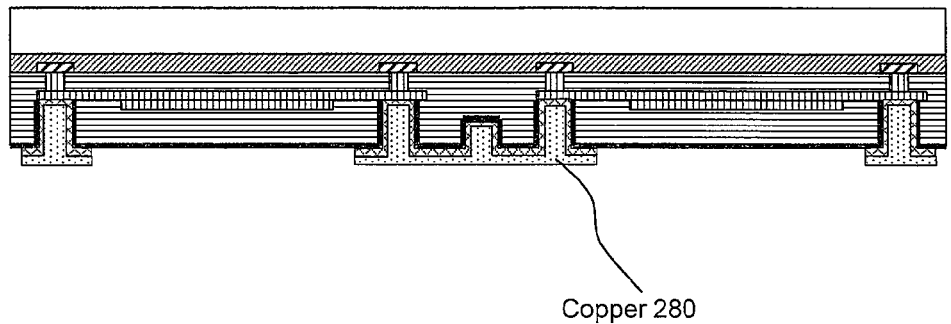
FIG. 2g is an illustration depicting another aspect of the example technique for forming the through-silicon-via and the sidewall pad for the semiconductor wafer, including filling the via.

FIG. 2g is an illustration depicting another aspect of the example technique for forming the through-silicon-via and the sidewall pad for wafer 200. For an embodiment, via holes 260 and partial depth hole 265 may be filled with an electrically conductive material. For one example, the holes may be filled with copper. For another example embodiment, the holes may be filled with polysilicon. Other example materials that may be used include, but are not limited to, gold, solder, tungsten, conductive paste, etc. However, these are merely example electrically conductive materials, and the scope of claimed subject matter is not limited in this respect. For one or more embodiments, example techniques for depositing conductive material may include, but are not limited to, electroless plating, immersion plating, solder printing, conductive paste printing or dispensing, and electrolytic plating techniques. With the depositing of the electrically conductive material in via holes 260, TSVs are formed, with electrically conductive paths extending completely through silicon layer 220 from bonding pads 250 located at previously formed vias 235 to solder pads 290 located at via holes 260.

Figure 2H:
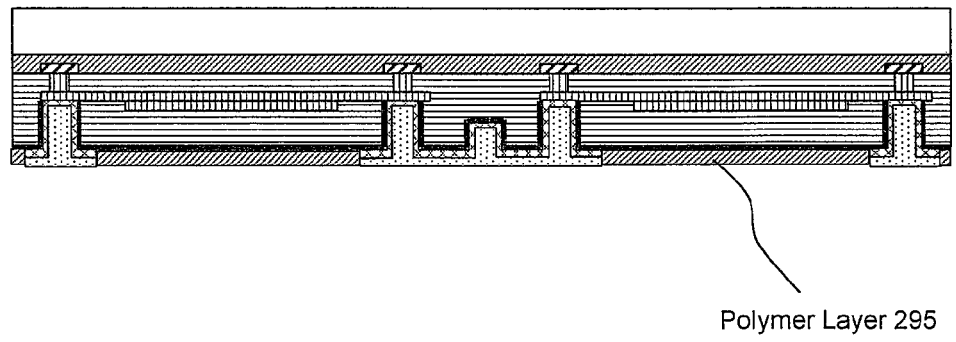
FIG. 2h is an illustration depicting an additional aspect of the example technique for forming the through-silicon-via and the sidewall pad for the semiconductor wafer, including forming a polymer layer.

FIG. 2h is an illustration depicting a still further aspect of the example technique for forming the through-silicon-via and the sidewall pad for wafer 200. For one or more embodiments, a layer 295 of polymer material may be deposited to the underside of wafer 200. Polymer layer 295 may provide additional structural integrity, and may further provide a surface to adhere to another semiconductor chip, for example, if employed in a stacked implementation. In addition, polymer layer 295 may define the locations for preparing solder onto the top of the filled vias to ensure that the solder does not bridge to another solder site, causing a short. For an example embodiment, polymer material 295 may comprise polymide (PI) or Benzocyclobutene (BCB), although the scope of claimed subject matter is not limited in this respect. Also for an embodiment, polymer layer 295 may be formed by spin coating and curing techniques, although again, the scope of claimed subject matter is not limited in this respect.

Figure 2I:
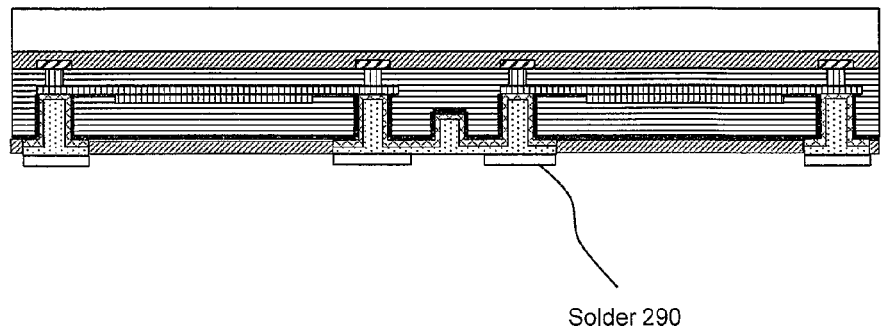
FIG. 2i is an illustration depicting a still further aspect of the example technique for forming the through-silicon-via and the sidewall pad for the semiconductor wafer, including forming solder bumps.

FIG. 2i is an illustration depicting an additional aspect of the example technique for forming the through-silicon-via and the sidewall pad for wafer 200. For an embodiment, solder 290 may be deposited in areas approximately coinciding with via holes 260. For one or more embodiments, solder 290 may comprise tin, a tin/lead compound, a tin/copper compound, a tin/silver/copper compound, a tin/indium compound, a tin/gold compound, etc., although the scope of claimed subject matter is not limited in this respect. Example techniques for forming solder 290 may include, but are not limited to, electroplating and/or solder paste micro-printing. As with other aspects described herein, embodiments in accordance with claimed subject matter are not limited to any particular techniques for depositing solder.

Figure 2J:
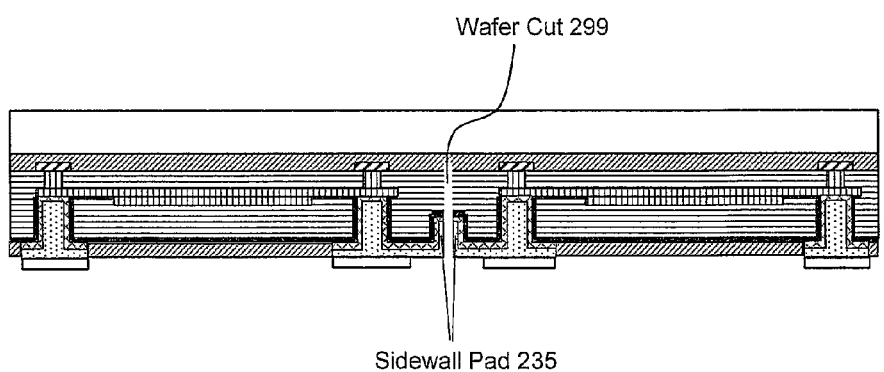
FIG. 2j is an illustration depicting yet another aspect of the example technique for forming the through-silicon-via and the sidewall pad for the semiconductor wafer, including dicing the wafer.

FIG. 2j is an illustration depicting yet another aspect of the example technique for forming the through-silicon-via and the sidewall pad for wafer 200. For the present example embodiment, two integrated circuits are depicted in FIGS. 2a-2j. Of course, other embodiments may, in general, comprise larger numbers of integrated circuit dice. However, for the present example, the two integrated circuits serve to illustrate one possible technique for forming sidewall pads 235. For an embodiment, as partial depth hole 265 is divided as wafer 200 is diced, as depicted in FIG. 2j, electrically conductive material 280 forms the pair of sidewall pads 235. One of the pair is associated with one of the integrated circuits, and the other of the pair is associated with the other integrated circuit. The wafer cut 299 for the present embodiment separates wafer 200 into two distinct chips. Also, wafer 200 may be de-bonded from holder 240 by raising the temperature above 180° C., for one or more embodiments.

For the example depicted in FIG. 2j, sidewall pads 235 are electrically coupled to TSVs. However, in other example embodiments, a separate electrically conductive path may couple the sidewall pads with the integrated circuits. For one example, polymer layer 495 may cover the electrically conductive material of the TSVs associated with the sidewall pads, and no solder pad may be provided such that an insulated electrically conductive path exists between the sidewall pads and the integrated circuits.

Figure 3:
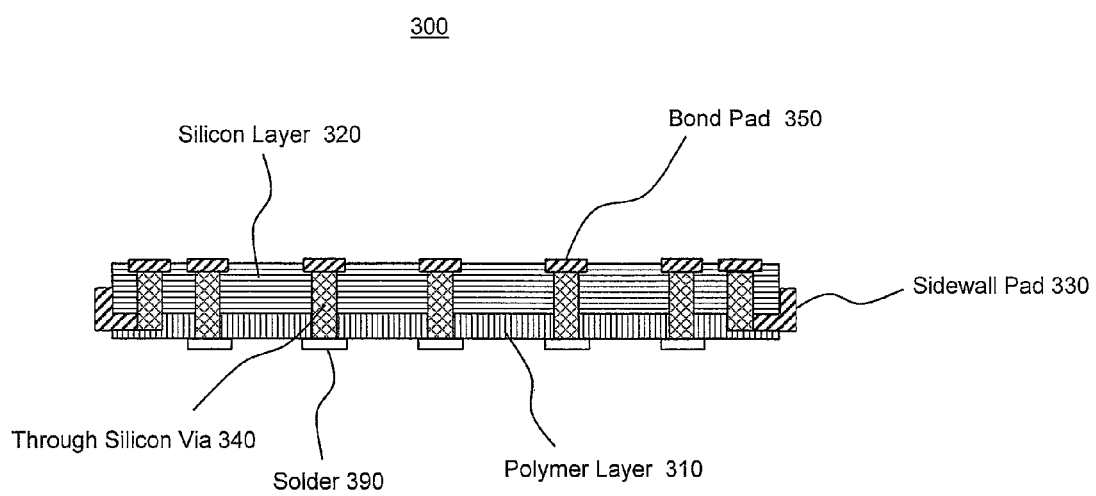
FIG. 3 is an illustration depicting a cross-sectional view of an example embodiment of a semiconductor device including through-silicon-via and sidewall interconnects.

FIG. 3 is an illustration depicting a cross-sectional view of an example embodiment of a semiconductor chip 300. Chip 300 for one or more embodiments may comprise a silicon layer 320. Although not shown in FIG. 3, semiconductor device 300 may comprise an integrated circuit formed in silicon layer 320. A number of through-silicon-vias 340 extend through silicon layer 320, as well as through a polymer layer 310. For this embodiment, a plurality of bond pads 350 are present on the upper surface of the silicon layer. As mentioned previously, bond pads 350 may already be present if the wafer has been designed and manufactured with wire-bonding in mind, as discussed above. As can be seen is FIG. 4, bond pads 350 are located at the top of the TSVs 340, and also at the top of the vias associated with sidewall pads 330. Of course, these vias may be formed according to example techniques described above. It may be worth noting that the vias associated with sidewall pads 330 do not extend all of the way through polymer layer 310 to prevent the via from making contact with a bond pad of a chip positioned below chip 300 in a stack. Also for an embodiment, solder pads 390 may be formed on the TSVs 340. Note that for the TSVs 340, there are a pair of pads. Bonding pads 350 for the present example are already present on the wafer, and solder pads 390 are formed according to example techniques describe herein.

TSVs 340 may be coupled to one or more common signals of the integrated circuit, and sidewall pads 330 may be coupled to one or more non-common signals associated with the integrated circuit. As can be seen below in FIG. 4, a number of semiconductor chips such as chip 300 may be stacked one upon another, with the TSVs providing interconnections between the chips for common signals. Although example embodiment described herein mention common signals associated with TSVs and non-common signals associated with sidewall pads, the scope of claimed subject matter is not so limited, and other embodiments are possible whereby one or more non-common signals may be associated with TSVs and whereby one or more common signals may be associated with sidewall pads.

Figure 4:
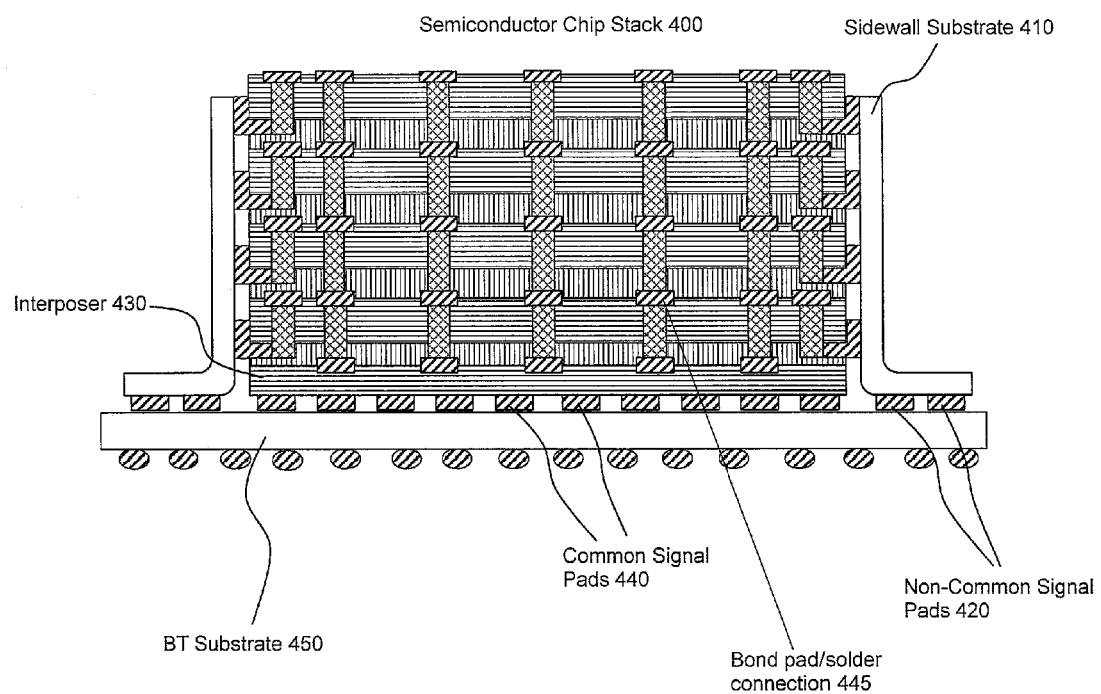
FIG. 4 is an illustration depicting a cross-sectional view of an example embodiment of a semiconductor chip stack.

FIG. 4 is an illustration depicting a cross-sectional view of an example embodiment of a semiconductor chip stack 400. For the example depicted in FIG. 4, semiconductor chip stack 400 comprises a NAND flash memory stack. For an embodiment, the chips of chip stack 400 may comprise similar chips. For one or more other embodiments, chips of chip stack 400 may comprise different types of chips. For one example embodiment, the chip stack may include one or more NAND flash chips, a DRAM chips, and an ASIC chip. Of course, these are merely examples of the types of chips that may make up a chip stack, and the scope of claimed subject matter is not limited in this respect. Also for this example, four semiconductor chips are depicted, although again, the scope of claimed subject matter is not limited in this respect, and other embodiments may utilize any of a wide number of chips.

The semiconductor chips of stack 400 may, for one or more example embodiments, comprise similar elements as semiconductor chip 300 depicted in FIG. 3, such as an integrated circuit formed in a silicon layer. A number of through-silicon-vias extend through the silicon layers, as well as through the polymer layers, for the plurality of chips. For an embodiment, a plurality of bond pads are formed on the upper surface of the silicon layers, and as depicted, the bond pads are located approximately at the top of the TSVs, and also at the top of the vias associated with the sidewall pads. The vias associated with the sidewall pads for this example embodiment do not extend all of the way through the polymer layers to prevent the vias from making contact with the bond pads of a chip positioned below the current chip in the stack. As with other embodiments described herein, the TSVs may be coupled to one or more common signals of the integrated circuits, and the sidewall pads may be coupled to one or more non-common signals associated with the integrated circuits. Also, for one or more embodiments, bond pads of a first chip may be electrically coupled to a second chip placed on top of the first chip by way of solder connections. Example solder pads are depicted above in connection with FIG. 3, for an embodiment. For the example of FIG. 4, a plurality of bond pad/solder connections 445 are depicted between the various chips of chip stack 400.

For the present embodiment, the stack of semiconductor chips are mounted on an interposer 430. Interposer 430 may comprise signal lines to distribute signals to and/or from the TSVs. For example, interposer 430 may include common signal pads 440 that may, for one example embodiment, be soldered to a substrate 450, which may, in turn, be soldered to a printed circuit board (not shown) in one or more embodiments. For the example depicted in FIG. 4, the common signals from chip stack 400 are coupled to the top of interposer 430. Interposer 430 may redistribute the common signals and the signals may be further coupled bonding pads at the bottom of the interposer which are in turn soldered to substrate 450, for the current example embodiment. For one or more embodiments, interposer 430 may comprise silicon, although the scope of claimed subject matter is not limited in this respect. Substrate 450 for one or more embodiments may comprise bismaleimide triazine (BT), although the scope of claimed subject matter is not limited in this respect.

Also depicted in FIG. 4 is sidewall substrate 410 coupled to a plurality of sidewall pads. As with other embodiments described herein, the sidewall pads may be associated with one or more non-common signals. For the present example embodiment where semiconductor chip stack 400 comprises a NAND flash memory stack, one or more non-common signals may comprise chip select signals. The chip select signals may be electrically coupled to substrate 450 for an embodiment. Sidewall substrate 410 for this example may comprise non-common signal pads 420. Of course, the chip select signals are merely an example of the types of signals that may be communicated by way of the sidewall pads and the sidewall substrate. In one or more example embodiments, sidewall substrate 410 may comprise a flexible sidewall substrate.

For an embodiment, the flexible sidewall substrate may comprise a pair of polymer layers sandwiching a copper layer, as previously described. However, this is merely an example embodiment of a sidewall substrate, and the scope of claimed subject matter is not limited in this respect.

Figure 5:
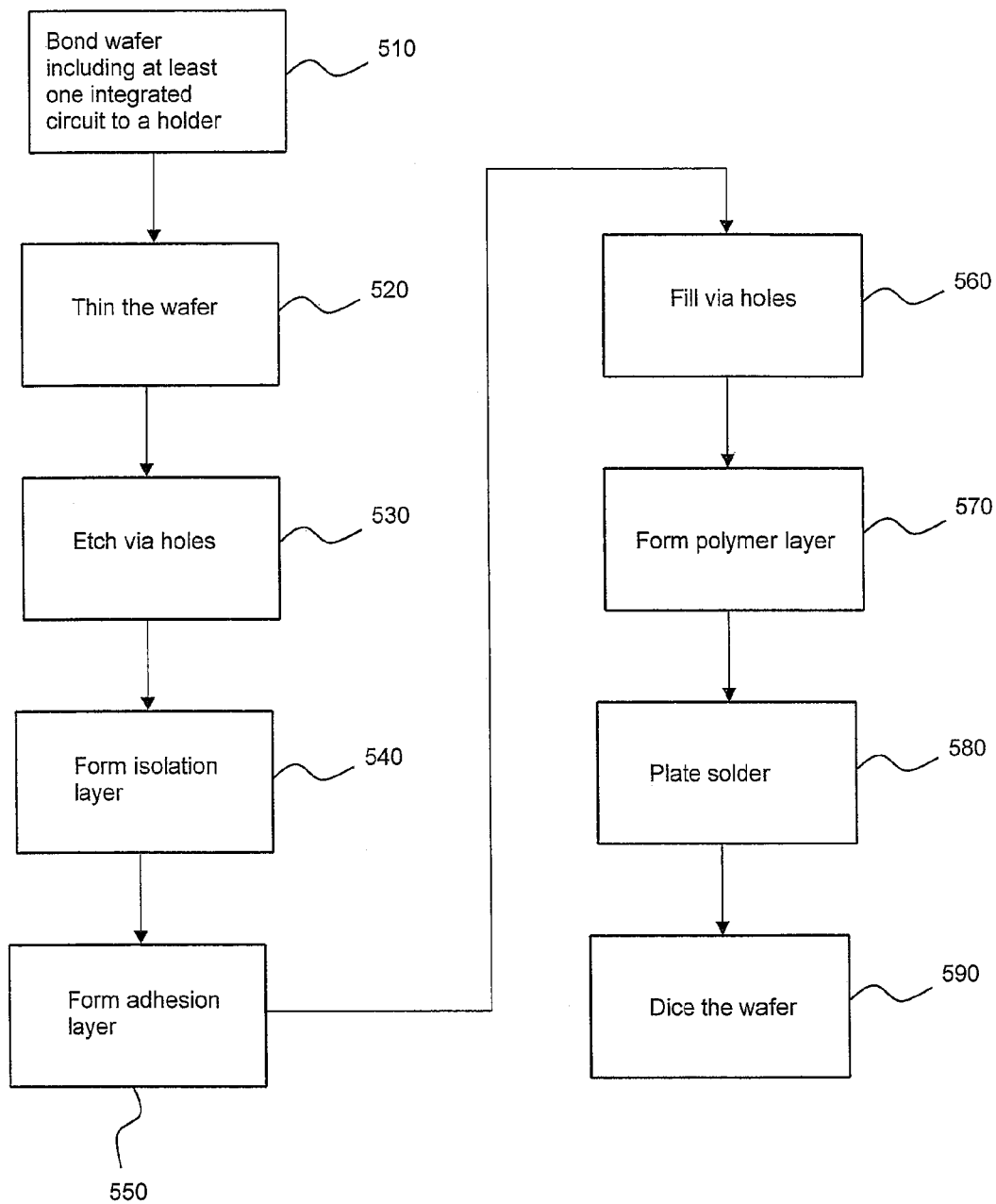
FIG. 5 is a flow diagram of an example embodiment of a method for forming a through-silicon-via and a sidewall pad for a semiconductor chip.

FIG. 5 is a flow diagram of an example embodiment of a method for forming a through-silicon-via and a sidewall pad for a semiconductor chip. Various aspects of the example method are explained in more detail above in connection with FIGS. 4a-4j. At block 510, a wafer supporting at least one integrated circuit may be bonded to a holder, and at block 520 the wafer may be thinned. Via holes may be etched at block 530, and at block 540 an isolation layer may be formed. At block 550, an adhesion layer may be formed over at least a portion of the isolation layer. The via holes may be filled at block 560, and a polymer base may be formed at block 570. Solder may be plated over the filled via holes at block 580, and the wafer may be diced at block 590. Embodiments in accordance with claimed subject matter may include all, less than, or more than blocks 510-590. Further, the order of blocks 510-590 is merely an example order, and the scope of claimed subject matter is not limited in this respect.

Figure 6:
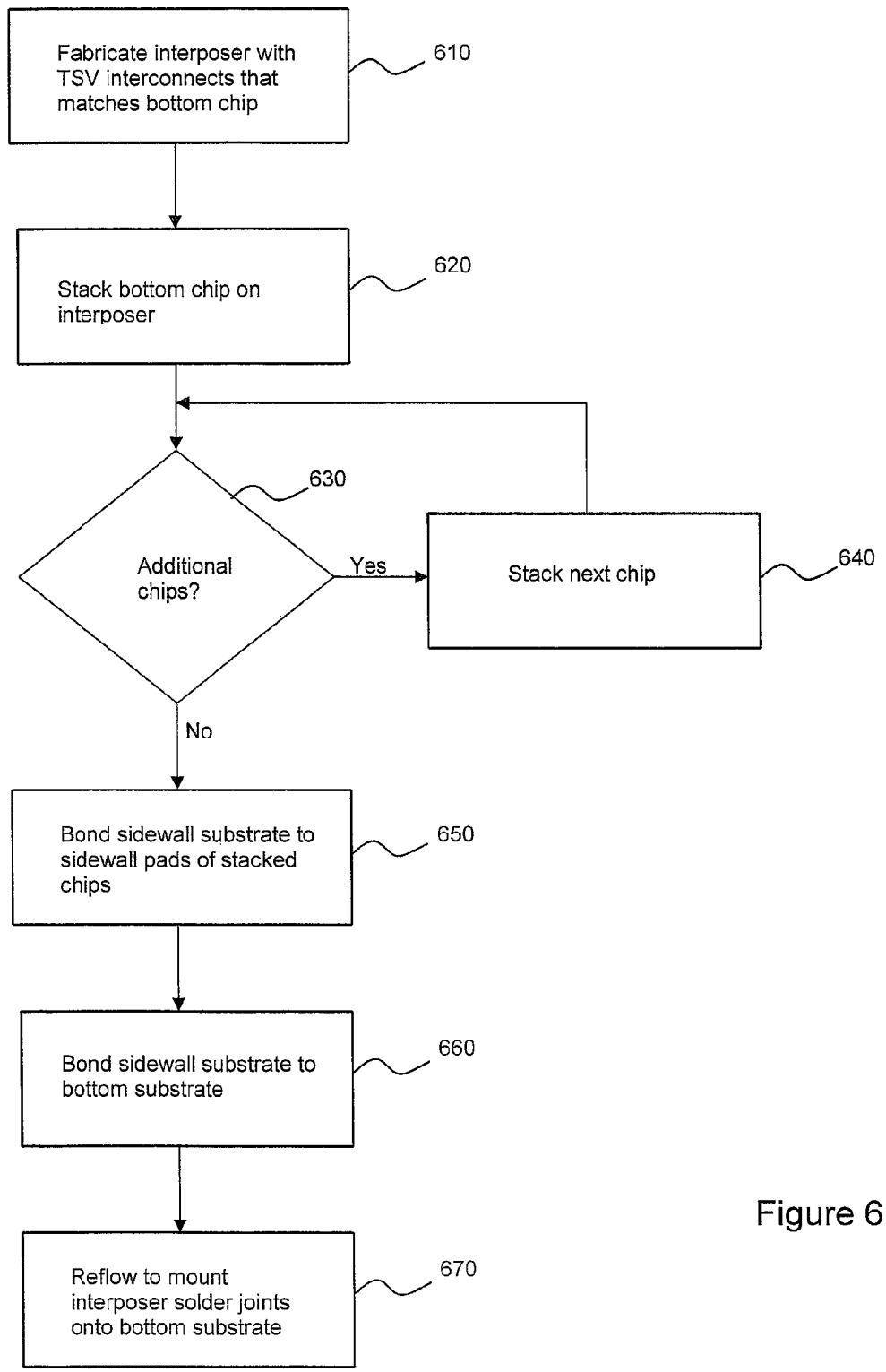
FIG. 6 is a flow diagram of an example embodiment of a method for assembling an example semiconductor device including stacked chips with through-silicon-vias and a sidewall pads.

FIG. 6 is a flow diagram of an example embodiment of a method for assembling a semiconductor device including stacked chips with TSV and sidewall pads. At block 610, an interposer may be fabricated with TSV interconnects that match the bottom chip of the eventual stack of chips, and at block 620 the bottom chip is installed on the interposer. If at block 630 it is determined that additional chips remain to be installed on the stack, the next chip is added to the stack at block 640. If at block 630 it is determined that no additional chips remain, at block 650 a sidewall substrate is bonded to the sidewall pads of the stacked chips. At block 660, the sidewall substrate may be bonded to a bottom substrate, and at block 670 solder is reflowed to mount solder joints from the interposer onto the bottom substrate. Of course, embodiments in accordance with claimed subject matter may include all, less than, or more than blocks 610-670. Further, the order of blocks 610-670 is merely an example order, and the scope of claimed subject matter is not limited in this respect.

The term "and/or" as referred to herein may mean "and", it may mean "or", it may mean "exclusive-or", it may mean "one", it may mean "some, but not all", it may mean "neither", and/or it may mean "both", although the scope of claimed subject matter is not limited in this respect.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

What is claimed is:

1. An apparatus, comprising:
   a plurality of semiconductor chips arranged in a stacked fashion, the plurality of chips individually comprising one or more first through-silicon-vias and one or more second through-silicon vias formed in a silicon layer and one or more sidewall pads, the one or more sidewall pads individually comprising a diced partial-depth hole in the silicon layer and filled with electrically conductive material and electrically coupled to the second through-silicon vias; and
   a sidewall substrate electrically coupled to the one or more sidewall pads, the one or more first through-silicon-vias of the plurality of semiconductor chips being electrically inter-connected to form one or more electrically conductive paths to conduct one or more common signals, the one or more second through-silicon vias of the plurality of semiconductor chips being electrically isolated one from another to conduct respective non-common signals by way of respective sidewall pads of the one or more sidewall pads.

2. The apparatus of claim 1, the one or more through-silicon-vias to electrically couple the one or more common signals from the plurality of semiconductor chips to a bottom substrate.

3. The apparatus of claim 1, the one or more through-silicon-vias to electrically couple the one or more common signals from the plurality of semiconductor chips to an interposer, the interposer further electrically coupled to a bottom substrate.

4. The apparatus of claim 3, wherein the sidewall substrate is electrically coupled to the bottom substrate.

5. The apparatus of claim 4, the one or more sidewall pads to electrically couple the one or more non-common signals from the plurality of semiconductor chips to the bottom substrate through the sidewall substrate.

6. The apparatus of claim 5, wherein the bottom substrate comprises bismaleimide triazine.

7. The apparatus of claim 1, wherein the sidewall substrate comprises a flexible sidewall substrate including an electrically conductive layer positioned between two layers of polymer.

8. The apparatus of claim 3, wherein the one or more common signals comprise one or more of an address signal and/or a data signal.

9. The apparatus of claim 5, wherein the one or more non-common signals comprise one or more of a plurality of chip select signals and/or a power signal.

10. The apparatus of claim 1, wherein the plurality of semiconductor chips comprise one or more of a flash memory chip, a dynamic random access memory chip, and/or an application specific integrated circuit chip.

11. A multi-chip semiconductor device, comprising:
    a plurality of semiconductor chips arranged in a stacked fashion, the plurality of semiconductor chips individually comprising one or more first through-silicon-vias and one or more second through-silicon vias formed in a silicon layer and one or more sidewall pads, the one or more sidewall pads individually comprising a diced partial-depth hole formed in the silicon layer and filled with electrically conductive material and electrically coupled to the second through-silicon vias;
    a sidewall substrate electrically coupled to the one or more sidewall pads, the one or more first through-silicon-vias of the plurality of semiconductor chips being electrically inter-connected to form one or more electrically conductive paths to conduct one or more common signals, the one or more second through-silicon vias of the plurality of semiconductor chips being electrically isolated one from another to conduct respective non-common signals by way of respective sidewall pads of the one or more sidewall pads; and
    a bottom substrate electrically coupled to the one or more sidewall pads via the sidewall substrate and the bottom substrate electrically coupled to the one or more first through-silicon vias.

12. The multi-chip semiconductor device of claim 11, further comprising an interposer disposed between the plurality of semiconductor chips and the bottom substrate, the interposer to electrically couple one or more signals from the one or more first through-silicon-vias to the bottom substrate.

13. The multi-chip semiconductor device of claim 11, wherein the plurality of semiconductor chips comprises one or more of a flash memory chip, a dynamic random access memory chip, and/or an application specific integrated circuit chip.

14. The multi-chip semiconductor device of claim 11, the one or more sidewall pads to electrically couple the one or more non-common signals from the bottom substrate to one or more of the plurality of semiconductor chips through the sidewall substrate.

15. The multi-chip semiconductor device of claim 11, the one or more first through-silicon-vias to electrically couple the one or more common signals from the interposer to the plurality of semiconductor chips.

16. The multi-chip semiconductor device of claim 11, wherein the sidewall substrate comprises a flexible sidewall substrate including an electrically conductive layer protected by two layers of a polymer material.

* * * * *